US012593413B2

(12) United States Patent
Yamaguchi et al.

(10) Patent No.: US 12,593,413 B2
(45) Date of Patent: Mar. 31, 2026

(54) STORAGE DEVICE HAVING A FLEXIBLE PRINTED CIRCUIT BOARD AND AN ELECTRONIC COMPONENT

(71) Applicants: Kabushiki Kaisha Toshiba, Tokyo (JP); Toshiba Electronic Devices & Storage Corporation, Tokyo (JP)

(72) Inventors: Hayato Yamaguchi, Yokohama (JP); Masahide Takazawa, Tokyo (JP); Shinra Yamanaka, Yokohama (JP); Nobuhiro Yamamoto, Yokohama (JP); Taichi Okano, Yokohama (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 160 days.

(21) Appl. No.: 18/499,899

(22) Filed: Nov. 1, 2023

(65) Prior Publication Data

US 2024/0324116 A1      Sep. 26, 2024

(30) Foreign Application Priority Data

Mar. 23, 2023      (JP) ................................ 2023-046352

(51) Int. Cl.

| | |
|---|---|
| *H05K 5/00* | (2025.01) |
| *H05K 1/03* | (2006.01) |
| *H05K 1/05* | (2006.01) |
| *H05K 1/11* | (2006.01) |
| *H05K 3/00* | (2006.01) |

(52) U.S. Cl.
CPC ......... *H05K 5/0069* (2013.01); *H05K 1/0393* (2013.01); *H05K 1/05* (2013.01); *H05K 1/116* (2013.01); *H05K 3/0094* (2013.01); *H05K 2201/10303* (2013.01)

(58) Field of Classification Search
CPC ...... H05K 5/0069; H05K 1/0393; H05K 1/05; H05K 1/116; H05K 3/0094; H05K 2201/10303; H05K 1/117; H05K 1/118; H05K 1/189; H05K 3/363; G11B 33/04; G11B 33/12
See application file for complete search history.

(56) References Cited

U.S. PATENT DOCUMENTS

| | | | | |
|---|---|---|---|---|
| 9,966,364 B2 * | 5/2018 | Chang | ..................... | H01L 25/50 |
| 10,008,797 B2 * | 6/2018 | Hassan-Ali | ........... | H05K 1/118 |
| 10,043,779 B2 * | 8/2018 | Prabhu | ................... | H01L 21/54 |

(Continued)

FOREIGN PATENT DOCUMENTS

| | | |
|---|---|---|
| JP | 2008-010798 A | 1/2008 |
| JP | 2019-075250 A | 5/2019 |

(Continued)

*Primary Examiner* — Rockshana D Chowdhury
(74) *Attorney, Agent, or Firm* — Kim & Stewart LLP

(57) ABSTRACT

A flexible printed circuit board of a storage device includes a first insulating layer, a first conductive layer on a first surface of the first insulating layer, and a second conductive layer on a second surface of the first insulating layer. The second surface is opposite the first surface. The first conductive layer is provided with a land. The second conductive layer covers the land via the first insulating layer in a first direction in which the first surface faces. An electronic component of the storage device includes a pin joined to the land.

18 Claims, 7 Drawing Sheets

(56)                    References Cited

U.S. PATENT DOCUMENTS

| | | | | |
|---|---|---|---|---|
| 10,103,201 B2 * | 10/2018 | Lin | ........................ | H05K 1/113 |
| 10,374,345 B2 | 8/2019 | Yamamoto et al. | | |
| 10,522,495 B2 * | 12/2019 | Liang | ................ | H01L 23/49838 |
| 10,580,460 B2 | 3/2020 | Ishizaki | | |
| 10,631,399 B2 * | 4/2020 | Mayer-Dick | ........... | H05K 1/181 |
| 10,811,041 B2 | 10/2020 | Yoshikawa | | |
| 11,209,872 B2 * | 12/2021 | Hong | ...................... | H01L 23/66 |
| 11,240,919 B2 * | 2/2022 | Yoshikawa | ............ | H01R 12/73 |
| 11,276,425 B2 | 3/2022 | Tokizaki | | |
| 11,523,507 B2 * | 12/2022 | Park | ...................... | H05K 1/147 |
| 11,576,255 B2 * | 2/2023 | Lee | ........................ | H05K 1/116 |
| 11,676,948 B2 * | 6/2023 | Ng | ...................... | H01L 25/0655 |
| | | | | 257/737 |
| 11,855,000 B2 * | 12/2023 | Lee | ...................... | H01L 21/565 |
| 11,876,085 B2 * | 1/2024 | Roy | ................... | H01L 21/4857 |
| 11,967,578 B2 * | 4/2024 | Lee | ........................ | H01L 24/19 |
| 11,968,788 B2 * | 4/2024 | Yang | ...................... | H05K 3/284 |
| 12,040,231 B2 * | 7/2024 | Han | ................. | H01L 21/76831 |
| 12,094,729 B2 * | 9/2024 | Lin | ................. | H01L 21/31058 |
| 12,154,859 B2 * | 11/2024 | Kim | ...................... | H01L 25/117 |
| 2012/0217049 A1 * | 8/2012 | Hanai | ................. | H05K 3/4697 |
| | | | | 174/260 |

FOREIGN PATENT DOCUMENTS

| | | | |
|---|---|---|---|
| JP | 2020-091934 A | 6/2020 | |
| JP | 2020-107378 A | 7/2020 | |
| JP | 2021-044036 A | 3/2021 | |
| JP | 2021-136044 A | 9/2021 | |

* cited by examiner

STORAGE DEVICE HAVING A FLEXIBLE PRINTED CIRCUIT BOARD AND AN ELECTRONIC COMPONENT

CROSS-REFERENCE TO RELATED APPLICATIONS

This application is based upon and claims the benefit of priority from Japanese Patent Application No. 2023-046352, filed on Mar. 23, 2023, the entire contents of which are incorporated herein by reference.

FIELD

Embodiments described herein relate generally to a storage.

BACKGROUND

A storage such as a hard disk drive includes a flexible printed circuit (FPC) board and an electronic component mounted on the FPC. For example, pins of the electronic component are joined to lands on the FPC.

There may be a situation that liquid is introduced into the storage. For example, a cleaning liquid is introduced to remove a possible contaminant such as flux from the storage. However, a gap between the FPC and the electronic component, if it occurs, may hinder a flow of the liquid. The liquid and flux may remain in the gap.

DETAILED DESCRIPTION

In general, according to one embodiment, a storage includes a flexible printed circuit board and an electronic component. The flexible printed circuit board includes a first insulating layer, a first conductive layer on a first surface of the first insulating layer, and a second conductive layer on a second surface of the first insulating layer. The second surface is opposite the first surface. The first conductive layer is provided with a land. The second conductive layer covers the land via the first insulating layer in a first direction in which the first surface faces. The electronic component includes a pin joined to the land.

First Embodiment

A first embodiment will be described below with reference to FIGS. 1 to 5. Note that, in some cases, a plurality of expressions is given for component elements according to the embodiments and for description of the component elements, in the present specification. The component elements and the descriptions thereof are presented by way of example only and are not limited by the expressions in the present specification. The component elements can be identified by names different from those in the present specification as well. In addition, different expressions from those in the present specification can be given for the component elements.

Figure 1:
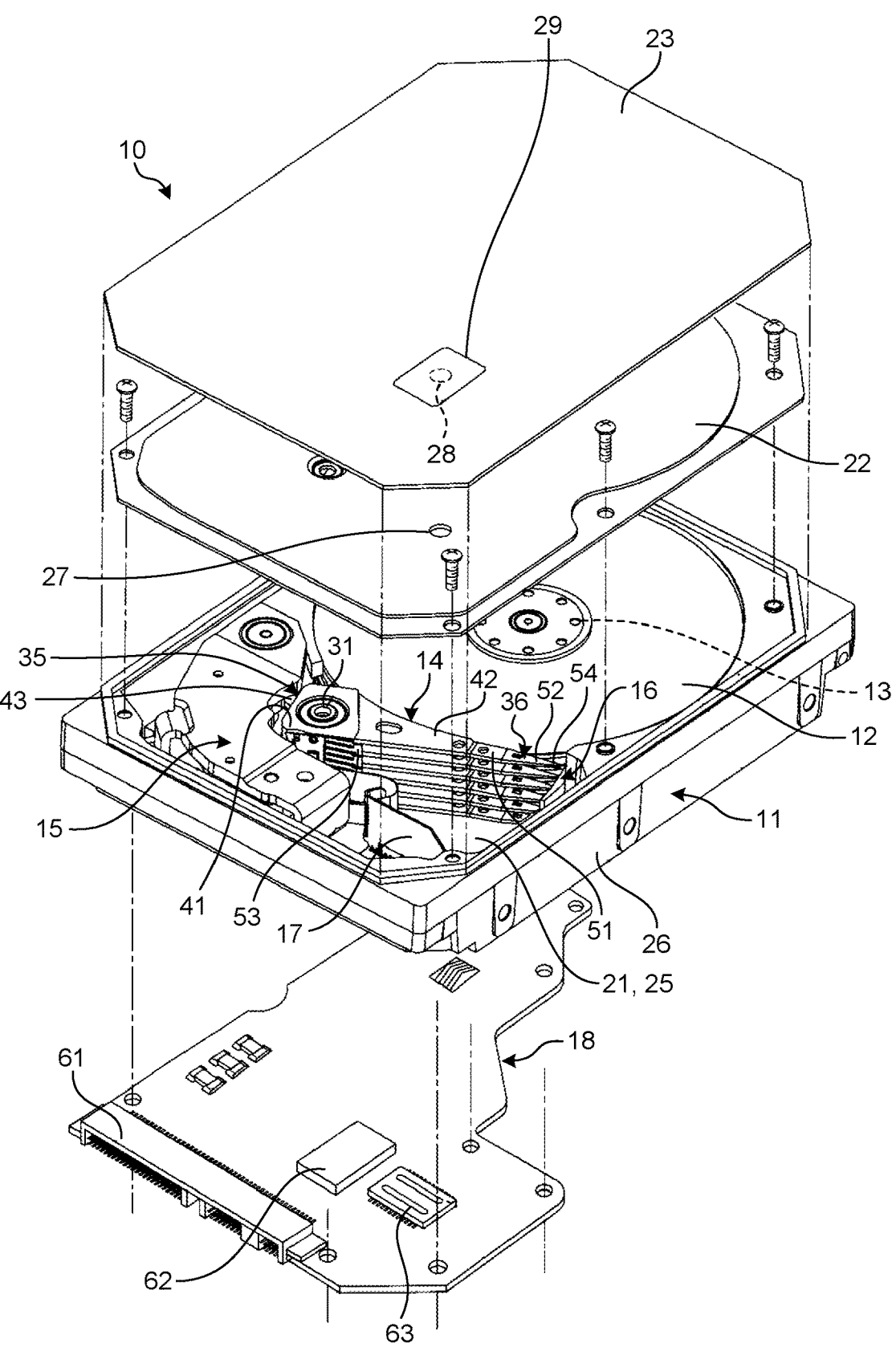
FIG. 1 is an exemplary perspective view of HDD according to a first embodiment.

FIG. 1 is an exemplary perspective view of a hard disk drive (HDD) 10 according to the first embodiment. The HDD 10 is an example of the storage (auxiliary storage device) and can also be referred to as an electronic device, storage device, external storage device, or magnetic disk drive. Note that the storage is not limited to the HDD 10. For example, the storage may be another device such as a solid state drive (SSD).

The HDD 10 includes a housing 11, a plurality of magnetic disks 12, a spindle motor 13, a head stack assembly (HSA) 14, a voice coil motor (VCM) 15, a ramp load mechanism 16, a flexible printed circuit (FPC) board 17, and a printed circuit board (PCB) 18.

The housing 11 includes a base 21, an inner cover 22, and an outer cover 23. The base 21 is a bottomed container and includes a bottom wall 25 and a side wall 26. The bottom wall 25 has a substantially rectangular (quadrangular) plate-like shape. The side wall 26 protrudes from the edges of the bottom wall 25. The bottom wall 25 and the side wall 26 are integrally formed.

The inner cover 22 is mounted to an end of the side wall 26, for example, with screws. The outer cover 23 covers the inner cover 22 and is hermetically fixed to the end of the side wall 26, for example, by welding.

The inside of the housing 11 is sealed. In the housing 11, the magnetic disks 12, the spindle motor 13, the HSA 14, the VCM 15, the ramp load mechanism 16, and the FPC 17 are arranged.

The inner cover 22 is provided with a vent 27. The outer cover 23 is also provided with a vent 28. After the components are mounted inside the base 21 and the inner cover 22 and the outer cover 23 are mounted to the base 21, air in the housing 11 is removed from the vents 27 and 28. Furthermore, the housing 11 is filled with a gas different from the air.

The gas filled in the housing 11 is, for example, a low density gas having a density lower than that of the air, an inert gas of low reactivity, or the like. For example, the housing 11 is filled with helium. Note that another fluid may be filled in the housing 11. In addition, the housing 11 may be maintained under vacuum, a low pressure closer to that of the vacuum, or a negative pressure lower than atmospheric pressure.

The vent 28 of the outer cover 23 is closed by a seal 29. The seal 29 hermetically seals the vent 28 to prevent the fluid filled in the housing 11 from leaking from the vent 28. Note that the inside and outside of the housing 11 may communicate with each other.

Each of the magnetic disks 12 is, for example, a disk including magnetic recording layers provided on both sides of the magnetic disk 12. The magnetic disk 12 has a diameter of, for example, 3.5 inches, but the diameter is not limited to this example. The plurality of magnetic disks 12 is stacked at intervals.

The spindle motor 13 supports and rotates the plurality of magnetic disks 12 stacked. The plurality of magnetic disks 12 is held on a hub of the spindle motor 13 by a clamp spring.

The HSA 14 is rotatably supported by a support shaft 31 that is arranged at a position spaced apart from the magnetic disks 12. The HSA 14 includes a carriage 35 and a plurality of head gimbal assemblies (HGAs) 36.

The carriage 35 includes an actuator block 41, a plurality of arms 42, and a holder 43. The actuator block 41 is rotatably supported by the support shaft 31, for example, via a bearing. The plurality of arms 42 protrudes from the actuator block 41 in a direction substantially orthogonal to the support shaft 31.

The plurality of arms 42 is arranged at intervals in a direction in which the support shaft 31 extends. Each of the arms 42 has a plate-like shape so as to enter a space between adjacent magnetic disks 12. The plurality of arms 42 extends substantially in parallel.

The holder 43 protrudes from the actuator block 41 in a direction opposite to the direction in which the arms 42 protrude. The holder 43 holds a voice coil of the VCM 15. The VCM 15 includes a pair of yokes, the voice coil arranged between the yokes, and a magnet provided in the yokes.

Each of the HGAs 36 is mounted to an end of the corresponding arm 42 and protrudes from the arm 42. Accordingly, the plurality of HGAs 36 is arranged at intervals in a direction in which the support shaft 31 extends. Each of the plurality of HGAs 36 includes a base plate 51, a load beam 52, a flexure 53, and a magnetic head 54. The magnetic head 54 can also be referred to as a slider.

The base plate 51 is mounted to the end of the arm 42. The load beam 52 has a thin plate-like shape that is thinner than the base plate 51. The load beam 52 is mounted to an end of the base plate 51 so as to protrude from the base plate 51.

The flexure 53 has an elongated strip shape. Note that the shape of the flexure 53 is not limited to this example. The flexure 53 is a multilayer plate including a metal plate (backing layer) that is formed of stainless steel or the like, an insulating layer that is formed on the metal plate, a conductive layer that is formed on the insulating layer to constitute a plurality of wires (wiring pattern), and a protective layer (insulating layer) that covers the conductive layer.

The flexure 53 is provided with a displaceable gimbal (elastic support) at one end above the load beam 52. The gimbal is provided at an end of the HGA 36, and the magnetic head 54 is mounted to the gimbal. The other end of the flexure 53 is connected to the FPC 17. Therefore, the FPC 17 is electrically connected to the magnetic heads 54 via the wires of the flexure 53.

The magnetic head 54 records and reproduces information, for each of the recording layers of each magnetic disk 12. In other words, the magnetic head 54 reads and writes information from and to the magnetic disk 12. The magnetic head 54 may have an element that generates a microwave or a laser beam.

The VCM 15 rotates the HSA 14 and positions the magnetic heads 54 to a desired position. When the magnetic heads 54 move to the outermost periphery of the magnetic disks 12, the ramp load mechanism 16 holds each magnetic head 54 at an unload position spaced apart from each magnetic disk 12.

The PCB 18 is, for example, a rigid board such as a glass epoxy board, and includes a multi-layer board, a build-up board, or the like. The PCB 18 is arranged outside the housing 11 and is mounted on the bottom wall 25 of the base 21. The PCB 18 is mounted on the bottom wall 25, for example, with a plurality of screws. For example, an interface (I/F) connector 61, a controller 62, a relay connector 63, and various other electronic components are mounted on the PCB 18.

The I/F connector 61 is a connector in conformity with an interface standard such as Serial ATA (SATA), and is connected to an I/F connector of a host computer. The HDD 10 receives power supply from the host computer through the I/F connector 61, and transmits and receives various data to and from the host computer.

The controller 62 is, for example, a system-on-chip (SoC), and includes a read/write channel (RWC), a hard disk controller (HDC), and a processor. The controller 62 controls the entire HDD 10 including, for example, the spindle motor 13, the VCM 15, and the magnetic heads 54.

The relay connector 63 is electrically connected to various components arranged inside the housing 11, for example, through a connector provided on the bottom wall 25. Therefore, the PCB 18 is electrically connected to the VCM 15, the FPC 17, the flexure 53, and the magnetic heads 54 arranged inside the housing 11.

Figure 2:
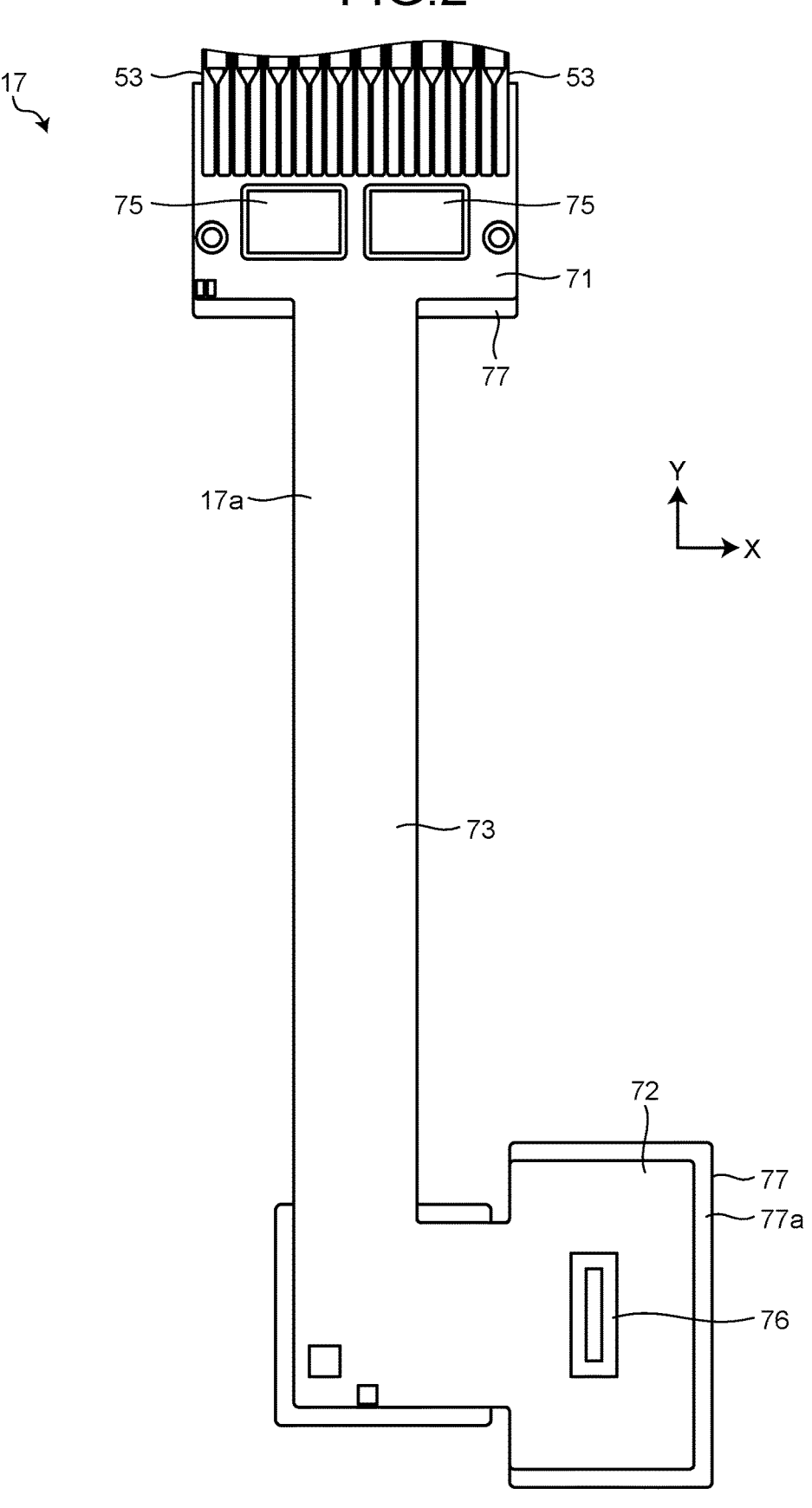
FIG. 2 is an exemplary plan view of FPC according to the first embodiment.

FIG. 2 is an exemplary plan view of the FPC 17 according to the first embodiment. As illustrated in FIG. 2, the FPC 17 has substantially an L-shaped strip, in a natural state where the FPC 17 is removed from the other components with no external force applied. Note that the shape of the FPC 17 is not limited to this example. The FPC 17 includes a first connecting part 71, a second connecting part 72, and an intermediate part 73.

The first connecting part 71 is provided, for example, at one end of the FPC 17 in a direction in which the FPC 17 extends. The first connecting part 71 is mounted to the actuator block 41 with, for example, a screw. The first connecting part 71 is electrically connected to the VCM 15 and the flexure 53.

The second connecting part 72 is provided, for example, at the other end of the FPC 17 in the direction in which the FPC 17 extends. The second connecting part 72 is mounted to the bottom wall 25 with, for example, a screw. The second connecting part 72 is electrically connected to the PCB 18, for example, through a connector provided on the bottom wall 25.

The intermediate part 73 is provided between the first connecting part 71 and the second connecting part 72. The intermediate part 73 extends in a strip shape and bends between the first connecting part 71 and the second connecting part 72 according to the rotation of the HSA 14.

As illustrated in the drawings, in the present specification, an X-axis, a Y-axis, and a Z-axis are defined for convenience. The X-axis, the Y-axis, and the Z-axis are orthogonal to each other. The X-axis extends along the width of the intermediate part 73 in the natural state. The Y-axis extends along the length of the intermediate part 73 in the natural state. The Z-axis extends along the thickness of the FPC 17 in the natural state.

Furthermore, in the present specification, an X-direction, a Y-direction, and a Z-direction are defined. The X-direction is a direction extending along the X-axis, and includes a +X-direction that is indicated by an X-axis arrow and a −X-direction that is an opposite direction to the direction indicated by the X-axis arrow. The Y-direction is a direction extending along the Y-axis, and includes a +Y-direction that is indicated by a Y-axis arrow and a −Y-direction that is an opposite direction to the direction indicated by the Y-axis arrow. The Z-direction is a direction extending along the Z-axis, and includes a +Z-direction that is indicated by a Z-axis arrow and a −Z-direction that is an opposite direction to the direction indicated by the Z-axis arrow.

The first connecting part 71 is connected to an end of the intermediate part 73 in the +Y-direction and extends in the +Y-direction from the end. The second connecting part 72 is connected to an end of the intermediate part 73 in the −Y-direction and extends in the +X-direction from the end. Note that the first connecting part 71 and the second connecting part 72 are not limited to this example.

The HDD 10 further includes a plurality of preamplifiers 75, a relay connector 76, and a plurality of reinforced plates 77. The relay connector 76 is an example of the electronic component. Note that the electronic component is not limited to the relay connector 76, and may be another component. Each of the reinforced plates 77 is an example of a wall.

The preamplifiers 75 are mounted on the first connecting part 71. The preamplifiers 75 are electrically connected to the magnetic heads 54 via, for example, the FPC 17 and the flexures 53. The preamplifiers 75 each amplifies a write signal, transmits the write signal to the magnetic head 54, and amplifies a read signal received from each magnetic head 54.

The relay connector 76 is mounted on the second connecting part 72. The relay connector 76 is electrically connected to the relay connector 63 of the PCB 18, for example, through a connector provided on the bottom wall 25. Therefore, the second connecting part 72 is connected to the PCB 18. Note that the relay connector 76 may be directly connected to the relay connector 63 of the PCB 18.

The reinforced plate 77 is made of, for example, metal such as aluminum or synthetic resin, and has a plate-like shape. Note that the reinforced plate 77 is not limited to this example. The plurality of reinforced plates 77 are mounted to the first connecting part 71 and the second connecting part 72.

Each reinforced plate 77 has a higher rigidity than the FPC 17. Therefore, the reinforced plate 77 improves the rigidity of each of the first connecting part 71 and the second connecting part 72. The intermediate part 73 is not mounted to any of the reinforced plates 77 and can be bent.

Figure 3:
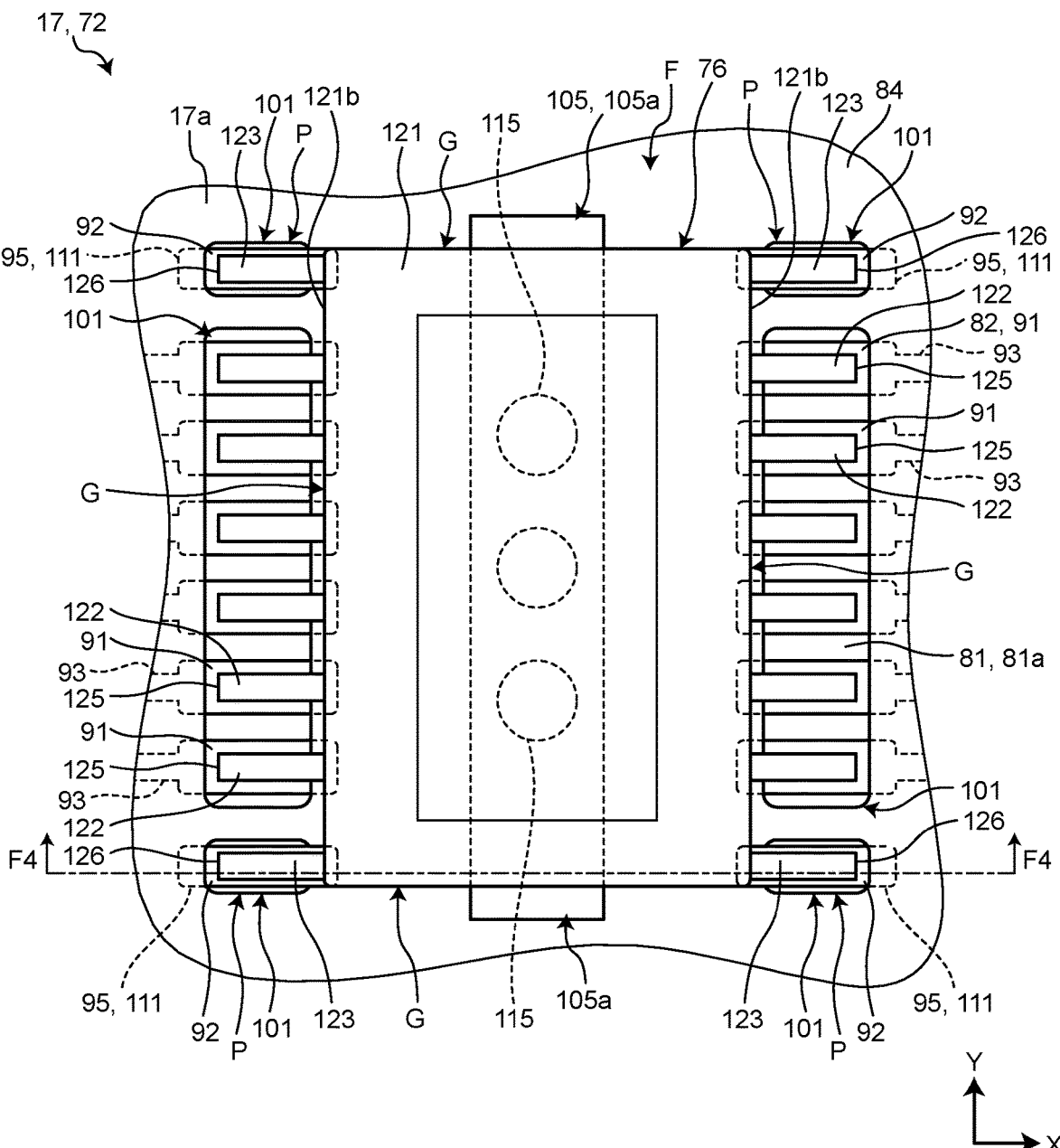
FIG. 3 is an exemplary plan view of part of a second connecting part according to the first embodiment.
Figure 4:
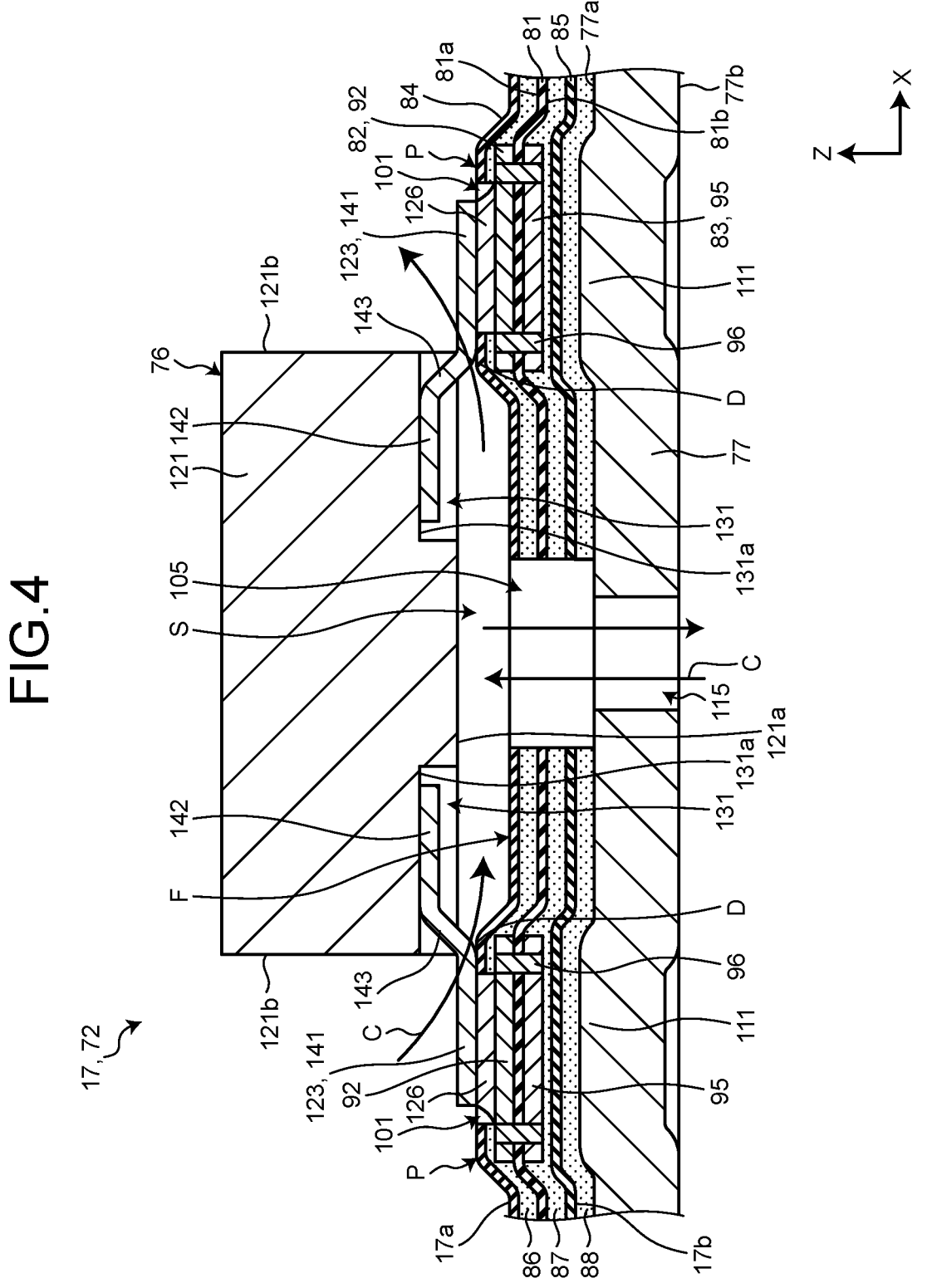
FIG. 4 is an exemplary cross-sectional view of a part of the second connecting part according to the first embodiment, taken along line F4-F4 of FIG. 3.

FIG. 3 is an exemplary plan view of part of the second connecting part 72 according to the first embodiment. FIG. 4 is an exemplary cross-sectional view of a part of the second connecting part 72 according to the first embodiment, taken along line F4-F4 of FIG. 3.

As illustrated in FIG. 4, the FPC 17 includes a mounting surface 17a and a back surface 17b. The mounting surface 17a is one side of the FPC 17. The preamplifiers 75 and the relay connector 76 are mounted on the mounting surface 17a. Therefore, the mounting surface 17a faces the preamplifiers 75 and the relay connector 76. The back surface 17b is opposite the mounting surface 17a. The back surface 17b faces the reinforced plate 77.

The FPC 17 includes a base layer 81, two conductive layers 82 and 83, two cover layers 84 and 85, and three adhesive layers 86, 87, and 88. The base layer 81 is an example of the first insulating layer. The conductive layer 82 is an example of the first conductive layer. The conductive layer 83 is an example of the second conductive layer. The cover layer 84 is an example of a second insulating layer.

Each of the base layer 81 and the cover layers 84 and 85 is made of, for example, an insulating material such as polyimide, and has an insulating property. In other words, the electrical resistance of each of the base layer 81 and the cover layers 84 and 85 is higher than the electrical resistance of each of the conductive layers 82 and 83.

The base layer 81 includes an upper surface 81a and a lower surface 81b. Note that the wording upper and lower in the present specification is used on the basis of a vertical direction in FIG. 4, for convenience, and is not intended to limit the direction, position, and other conditions. The upper surface 81a is an example of the first surface. The lower surface 81b is an example of the second surface.

The upper surface 81a is a surface of the base layer 81 facing substantially in the +Z-direction. The lower surface 81b is opposite the upper surface 81a, facing substantially in the −Z-direction. Note that the upper surface 81a and the lower surface 81b may have irregularities.

Each of the two conductive layers 82 and 83 is made of, for example, a conductive material such as copper and has conductivity. The conductive layer 82 overlies the upper surface 81a of the base layer 81. The conductive layer 83 underlies the lower surface 81b of the base layer 81.

As illustrated in FIG. 3, the conductive layer 82 is provided with a plurality of connection pads 91, a plurality of reinforcement pads 92, and a plurality of wires 93. At least one of the connection pads 91 is an example of a third land. The plurality of reinforcement pads 92 is an example of a land and a first land.

For example, each of the plurality of connection pads 91 transmits an electric signal, is set to a power supply, or is set to a ground potential. For example, the plurality of reinforcement pads 92 is set to the ground potential.

The plurality of pads including the plurality of connection pads 91 and the plurality of reinforcement pads 92 are arranged in two rows in the Y-direction. In the X-direction, the two rows of the connection pads 91 and reinforcement pads 92 individually oppose each other with an interval. The X-direction is a direction along the upper surface 81a of the base layer 81, and is an example of a second direction.

The FPC 17 of the present embodiment has a part including no conductive layer 82, in-between the two reinforcement pads 92 disposed in the X-direction. In other words, the conductive layer 82 is provided with a gap, space, or distance between the two reinforcement pads 92 disposed in the X-direction.

Two reinforcement pads 92 are located at both ends of each row of the connection pads 91 and reinforcement pads 92. In other words, the plurality of connection pads 91 are arranged at intervals in the Y-direction between the two reinforcement pads 92.

The plurality of wires 93 extends from the plurality of connection pads 91. The plurality of wires 93 electrically connects, for example, the plurality of connection pads 91 and the preamplifiers 75. Note that each of the wires 93 may be connected to another wire, a via hole, a ground, or another conductor.

As illustrated in FIG. 4, the conductive layer 83 is provided with a plurality of support pads 95. Each of the support pads 95 is an example of a second land. The conductive layer 83 may include another part such as wiring. The plurality of support pads 95 is electrically connected to a ground pattern via, for example, wiring and set to the ground potential. Note that the support pads 95 are not limited to this example.

The number of the support pads 95 is equal to the number of the reinforcement pads 92. Note that the number of the reinforcement pads 92 may be different from the number of the support pads 95. On a projection plane as viewed in the +Z-direction, the plurality of support pads 95 is arranged at substantially the same position as the plurality of reinforcement pads 92. Thus, the two each support pads 95 are disposed at an interval in the X-direction, as with the two reinforcement pads 92.

The projection plane as viewed in the +Z-direction is, for example, a plane (projection plane) of the second connecting part 72 opposite to the plane (projection plane) of the second connecting part 72 illustrated in FIG. 3. Therefore, the positions and shapes of various elements on the projection plane as viewed from the +Z-direction are substantially equal to the positions and shapes of the various elements in FIG. 3.

As illustrated in FIG. 4, the FPC 17 of the present embodiment has a part including no conductive layer 83, in-between the two support pads 95 disposed in the X-direction. In other words, the conductive layer 83 is provided with a gap space, or distance between the two support pads 95 disposed in the X-direction.

The plurality of support pads 95 individually covers the corresponding reinforcement pads 92 in the +Z-direction via the base layer 81. The +Z-direction is an example of the first direction. In other words, the plurality of reinforcement pads 92 and the plurality of support pads 95 overlap each other via the base layer 81.

In the present embodiment, on the projection plane as viewed in the +Z-direction, the plurality of reinforcement pads 92 and the plurality of support pads 95 have the same shape. Therefore, the plurality of reinforcement pads 92 and the plurality of support pads 95 substantially completely overlap each other. Note that the plurality of reinforcement pads 92 may have different shapes from each other, or the plurality of support pads 95 may have different shapes from each other. In this case, the individual reinforcement pads 92 and their corresponding support pads 95 have substantially the same shape.

The conductive layer 83 may be provided with one large pattern such as a ground plane instead of the plurality of support pads 95. In this configuration, for example, the one pattern covers the plurality of reinforcement pads 92 in the +Z-direction, via the base layer 81.

On the projection plane as viewed in the +Z-direction, each of the plurality of support pads 95 is spaced from the plurality of connection pads 91. In other words, the plurality of support pads 95 does not cover the plurality of connection pads 91. Note that the conductive layer 83 may cover the plurality of connection pads 91 in the +Z-direction via the base layer 81.

The base layer 81 is provided with a plurality of vias 96. Each of the plurality of vias 96 penetrates the base layer 81 and connects the corresponding reinforcement pad 92 and support pad 95. Accordingly, the reinforcement pad 92 and the support pad 95 are set to substantially the same potential. In the present embodiment, the reinforcement pad 92 and the support pad 95 are set to the ground potential.

The cover layer 84 covers at least part of the upper surface 81a of the base layer 81 and at least part of the conductive layer 82. Thus, the conductive layer 82 is interposed between the base layer 81 and the cover layer 84. For example, the cover layer 84 covers part of the connection pads 91, part of the reinforcement pads 92, and the wires 93.

The cover layer 84 is provided with a plurality of holes 101. Each of the plurality of holes 101 exposes at least one of the plurality of connection pads 91 and the plurality of reinforcement pads 92 to the outside of the FPC 17.

The cover layer 84 and part of the plurality of connection pads 91 and plurality of reinforcement pads 92 which are exposed to the outside of the FPC 17 through the hole 101 form the mounting surface 17a of the FPC 17. The mounting surface 17a may include another part such as the upper surface 81a of the base layer 81 exposed to the outside of the FPC 17 through the hole 101.

The cover layer 85 covers at least part of the lower surface 81b of the base layer 81 and the conductive layer 83. Thus, the conductive layer 83 is positioned between the base layer 81 and the cover layer 85. Note that the cover layer 85 may expose part of the conductive layer 83 to the outside of the FPC 17. The cover layer 85 forms the back surface 17b of the FPC 17.

The adhesive layers 86, 87, and 88 are each, for example, an insulating adhesive. The adhesive layer 86 bonds the cover layer 84 to the upper surface 81a of the base layer 81 and the conductive layer 82. The adhesive layer 87 bonds the cover layer 85 to the lower surface 81b of the base layer 81 and the conductive layer 83. The adhesive layer 88 bonds the reinforced plate 77 to the back surface 17b of the FPC 17.

The FPC 17 is provided with a through-hole 105. The through-hole 105 penetrates the FPC 17 in substantially the Z-direction. In other words, the through-hole 105 extends through the base layer 81, the cover layers 84 and 85, and the adhesive layers 86, 87, and 88. Note that the base layer 81 and the cover layer 85 may not be provided with the through-hole 105.

As illustrated in FIG. 3, the through-hole 105 is located between the two connection pads 91 and between the two reinforcement pads 92 disposed in the X-direction. The through-hole 105 extends substantially in the Y-direction.

As illustrated in FIG. 4, the reinforced plate 77 covers the back surface 17b of the FPC 17. Thus, the conductive layer 83 and the cover layer 85 are interposed between the base layer 81 and the reinforced plate 77. The reinforced plate 77 includes an attachment surface 77a and a back surface 77b. The attachment surface 77a is an example of a third surface and an attachment surface.

The attachment surface 77a is substantially flat and faces substantially in the +Z-direction. The attachment surface 77a is attached to the back surface 17b of the FPC 17 with the adhesive layer 88. The back surface 77b is opposite the attachment surface 77a. The back surface 77b is substantially flat and faces substantially in the −Z-direction.

The reinforced plate 77 further includes a plurality of protrusions 111. Each of the protrusions 111 is an example of a protruding part and a protrusion. The plurality of protrusions 111 protrudes substantially in the +Z-direction from the attachment surface 77a of the reinforced plate 77.

The number of the protrusions 111 is equal to the number of the reinforcement pads 92. On the projection plane as viewed in the +Z-direction, the plurality of protrusions 111 is disposed at substantially the same position as the plurality of reinforcement pads 92. Thus, two each protrusions 111 are disposed at an interval in the X-direction.

The reinforced plate 77 of the present embodiment includes part of the attachment surface 77a between the two protrusions 111 disposed in the X-direction, the part provided with no protrusions 111. In other words, the reinforced plate 77 is provided with a gap, space, or distance between the two protrusions 111 disposed in the X-direction.

The plurality of protrusions 111 individually covers the corresponding reinforcement pads 92 in the +Z-direction via the cover layer 85 and the base layer 81. In other words, the plurality of reinforcement pads 92 and the plurality of protrusions 111 overlap each other via the base layer 81 and the cover layer 85.

On the projection plane as viewed in the +Z-direction, the shape of the plurality of reinforcement pads 92 and the shape of the plurality of protrusions 111 are roughly the same.

Each of the plurality of reinforcement pads 92 has a shape roughly equal to that of a corresponding one of the plurality of protrusions 111.

On the projection plane as viewed in the +Z-direction, each of the plurality of protrusions 111 is separated from the plurality of connection pads 91. Note that the protrusion 111 may cover the plurality of connection pads 91 in the +Z-direction via the base layer 81.

The reinforced plate 77 is provided with a plurality of through-holes 115. The plurality of through-holes 115 are separated from the plurality of protrusions 111. The plurality of through-holes 115 penetrates the reinforced plate 77 in substantially the Z-direction and communicate with the through-hole 105 of the FPC 17.

As illustrated in FIG. 3, the relay connector 76 includes a case 121, a plurality of lead wires 122, and a plurality of reinforced pins 123. Each of the lead wires 122 is an example of a second pin. Each of the reinforced pin 123 is an example of a pin and a first pin.

The case 121 is, for example, a part of the relay connector 76, formed of an insulating material such as a synthetic resin. A conductor including the lead wire 122 and the reinforced pins 123 are attached to the case 121.

As illustrated in FIG. 4, the case 121 includes a lower surface 121*a* and a plurality of side surfaces 121*b*. The lower surface 121*a* faces the mounting surface 17*a* of the FPC 17. Each of the side surfaces 121*b* faces in a direction intersecting a direction in which the lower surface 121*a* faces. For example, each of the plurality of side surfaces 121*b* faces in the X-direction or the Y-direction.

As illustrated in FIG. 3, the plurality of lead wires 122 and the plurality of reinforced pins 123 are arranged on the side surfaces 121*b* facing in the X-direction. The plurality of lead wires 122 and the reinforced pins 123 are arranged in two rows in the Y-direction. In the X-direction, the two rows of the lead wires 122 and reinforced pins 123 individually oppose each other with an interval.

The plurality of lead wires 122 is individually joined to the corresponding connection pads 91 with solder 125. In other words, the plurality of lead wires 122 are soldered to the connection pads 91. In this manner, the relay connector 76 is mounted on the FPC 17. The plurality of reinforced pins 123 is individually joined to the corresponding reinforcement pads 92 with solder 126.

As illustrated in FIG. 4, the FPC 17 is interposed between the relay connector 76 and the reinforced plate 77. The reinforced plate 77 covers the relay connector 76 entirely in the +Z-direction via the FPC 17. In this manner, the reinforced plate 77 is able to support the relay connector 76 via the FPC 17.

The gap between the two opposing reinforcement pads 92 lies in-between the relay connector 76 and the base layer 81. The relay connector 76 covers the through-hole 105 of the FPC 17 and the through-holes 115 of the reinforced plate 77 in the −Z-direction.

As illustrated in FIG. 3, the through-hole 105 is longer in length than the relay connector 76 in the Y-direction. On the projection plane as viewed in the +Z-direction, both ends 105*a* of the through-hole 105 in the Y-direction are located outside the relay connector 76. The Y-direction is a direction along the upper surface 81*a* of the base layer 81 and orthogonal to the X-direction, and the Y-direction is an example of a third direction. Note that on the projection plane as viewed in the +Z-direction, one of both ends 105*a* of the through-hole 105 in the Y-direction may be located inside the relay connector 76.

Figure 5:
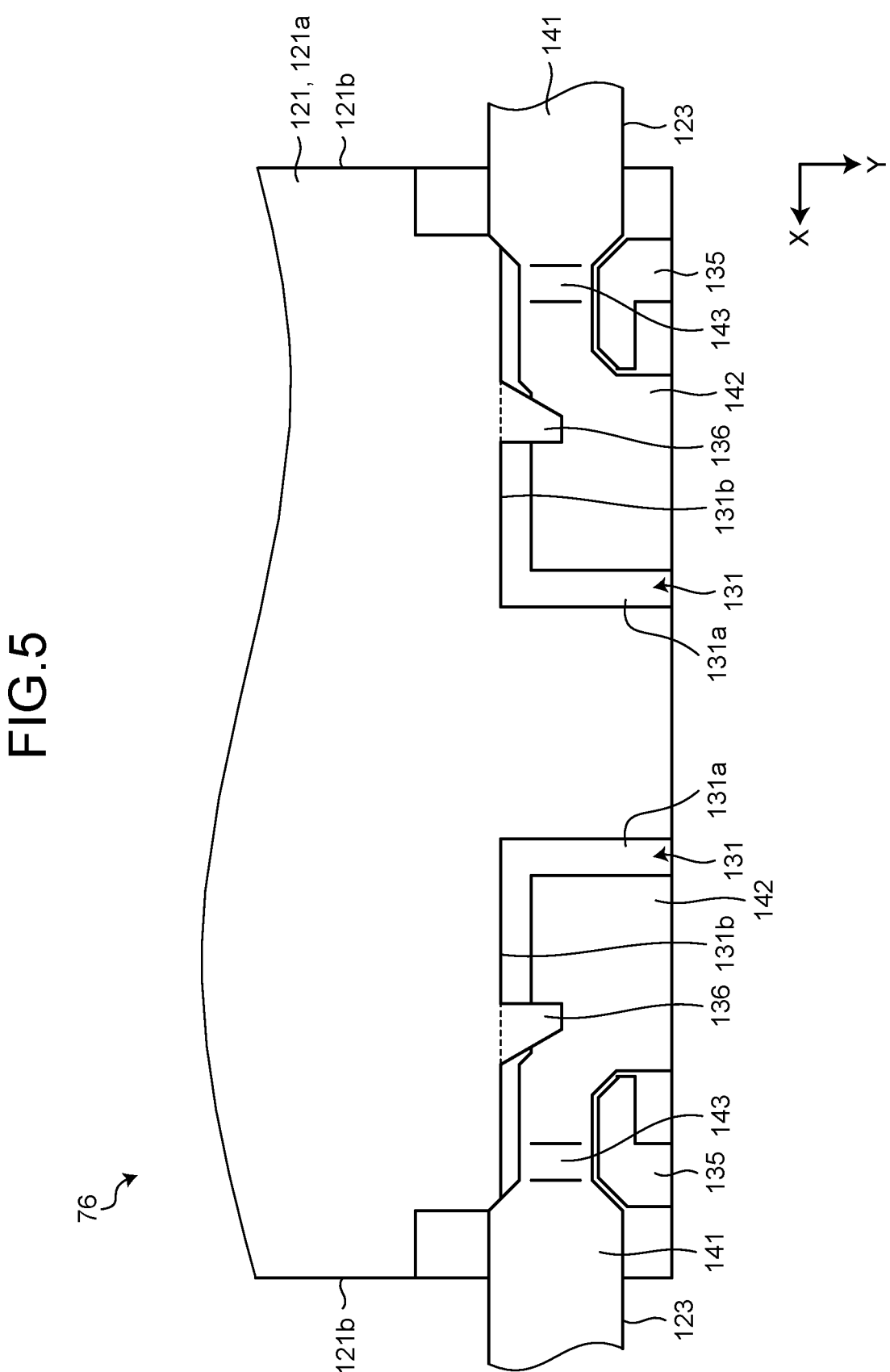
FIG. 5 is an exemplary bottom view of a relay connector according to the first embodiment.

FIG. 5 is an exemplary bottom view of the relay connector 76 according to the first embodiment. As illustrated in FIG. 5, the case 121 is provided with a plurality of cutouts 131. Each of the plurality of cutouts 131 opens in a side surface 121*b* facing in the X-direction, a side surface 121*b* facing in the Y-direction, and the lower surface 121*a*.

In the case 121, the cutout 131 further includes a bottom surface 131*a* and an inner side surface 131*b*. The bottom surface 131*a* faces substantially in the −Z-direction. The inner side surface 131*b* faces in a direction intersecting a direction in which the bottom surface 131*a* faces. For example, the inner side surface 131*b* faces substantially in the Y-direction.

The case 121 further includes a plurality of holding protrusions 135 and 136. The holding protrusion 135 protrudes from the bottom surface 131*a* substantially in the −Z-direction, at a position separated from the inner side surface 131*b*. The holding protrusion 136 protrudes from the inner side surface 131*b*, at a position separated from the bottom surface 131*a* in the −Z-direction.

The reinforced pins 123 are attached to the case 121 by fitting into the cutouts 131 of the case 121. The reinforced pin 123 may be partially embedded in the case 121. The plurality of reinforced pins 123 partially protrudes from the side surfaces 121*b* of the case 121.

As illustrated in FIG. 4, each of the plurality of reinforced pins 123 includes a joined part 141, a base 142, and an intermediate part 143. The joined part 141, the base 142, and the intermediate part 143 are integrally formed.

The joined part 141 extends substantially in the X-direction. At least part of the joined part 141 is positioned outside the cutout 131. The joined part 141 is joined to the reinforcement pad 92 via the solder 126.

The base 142 is housed in the cutout 131 and attached to the case 121. Therefore, the base 142 is provided between the joined part 141 and the case 121. Note that the base 142 may be positioned outside the cutout 131. The base 142 is separated from the joined part 141 in the X-direction. Furthermore, the base 142 is separated from the upper surface 81*a* relative to the joined part 141, in the Z-direction.

The intermediate part 143 is provided between the joined part 141 and the base 142. The intermediate part 143 extends obliquely toward the upper surface 81*a* between an end of the joined part 141 in the X-direction and an end of the base 142 in the X-direction. The intermediate part 143 extends away from the upper surface 81*a* as approaching the base 142 from the joined part 141.

As illustrated in FIG. 5, part of the joined part 141, part of the base 142, and the intermediate part 143 are positioned between the inner side surface 131*b* of the cutout 131 and the holding protrusion 135. Furthermore, the base 142 is positioned between the bottom surface 131*a* of the cutout 131 and the holding protrusion 136. Therefore, the holding protrusions 135 and 136 hold the reinforced pin 123.

As illustrated in FIG. 4, the plurality of protrusions 111 of the reinforced plate 77 overlaps the plurality of reinforcement pads 92 and plurality of support pads 95 of the FPC 17. A part of the FPC 17 separated from the protrusions 111 is attached to the attachment surface 77*a* of the reinforced plate 77 recessed relative to the protrusions 111, by the adhesive layer 88. Therefore, the parts of the FPC 17 where the reinforcement pads 92 and the support pads 95 are provided protrude from the other part in the +Z-direction.

Furthermore, the plurality of support pads 95 overlap the plurality of reinforcement pads 92. Therefore, the parts of the FPC 17 where the plurality of support pads 95 is provided have an increased thickness due to the plurality of reinforcement pads 92, and protrude from the other part in the +Z-direction.

As described above, the parts of the FPC 17 where the reinforcement pads 92 are provided are made to protrude in the +Z-direction by the protrusions 111 and the support pads 95. Therefore, the relay connector 76 is raised in the +Z-direction by the protrusions 111 and the support pads 95.

The FPC 17 described above includes a plurality of raised parts P and a flat part F. The plurality of raised parts P are parts of the FPC 17 where the reinforcement pads 92, the support pads 95, and the protrusions 111 overlap. The flat part F is the other part of the FPC 17.

The mounting surface 17a of the FPC 17 in each raised part P protrudes in the +Z-direction from the mounting surface 17a of the FPC 17 in the flat part F. In the present embodiment, the FPC 17 includes four raised parts P.

The lower surface 121a of the case 121 of the relay connector 76 faces the mounting surface 17a of the flat part F. A space S is provided between the lower surface 121a of the case 121 and the mounting surface 17a of the flat part F. The protrusions 111 and the support pads 95 raise the relay connector 76 to form the space S or enlarge the space S.

The through-hole 105 of the FPC 17 communicates with the space S. Therefore, the space S communicates with the outside through the ends 105a of the through-hole 105. Furthermore, the through-holes 115 of the reinforced plate 77 communicates with the space S via the through-hole 105. Therefore, the space S communicates with the outside through the through-hole 105 and the through-holes 115.

As illustrated in FIG. 3, between the four raised parts P, gaps G are provided between the case 121 of the relay connector 76 and the mounting surface 17a of the flat part F. The protrusions 111 and the support pads 95 raise the relay connector 76 to form the gaps G or enlarge the gaps G. The space S communicates with the outside through the gaps G.

An example of a method of mounting the relay connector 76 on the FPC 17 will be partially described below. The method of mounting the relay connector 76 on the FPC 17 is not limited to the following method, and another method may be used. First, solder paste (solders 125 and 126) is supplied to the connection pads 91 and the reinforcement pads 92, for example, by printing or coating.

Next, the relay connector 76 is mounted on the connection pads 91 and the reinforcement pads 92. The reinforced plate 77 supports the relay connector 76 via the FPC 17, and thus, it is possible to suppress deformation of the FPC 17 upon mounting.

Next, the FPC 17 is heated in a reflow furnace, and the solder paste is melted. As a result, each lead wire 122 is joined to each connection pad 91, and each reinforced pin 123 is joined to each reinforcement pad 92. At this time, the flux mixed with the solders 125 and 126 or separately supplied from the solders 125 and 126 flows out from the solders 125 and 126, in some cases.

Next, the FPC 17 is cleaned by, for example, ultrasonic cleaning. For example, the FPC 17 is placed in a tank filled with a cleaning liquid C. As indicated by arrows in FIG. 4, the cleaning liquid C flows into the space S through the through-holes 115 and 105. The cleaning liquid C can be discharged from the space S to the outside of the FPC 17 through the through-holes 105 and 115. Furthermore, the cleaning liquid C flows into the space S through the gaps G. The cleaning liquid C can be discharged from the space S to the outside of the FPC 17 through the gaps G.

The cleaning liquid C flows into the space S and is discharged from the space S. In other words, the cleaning liquid C flows through the space S. This configuration makes it possible for the cleaning liquid C to remove a substance, such as flux, that may contaminate the HDD 10, from the space S.

When the ultrasonic cleaning is completed, the FPC 17 is taken out from the cleaning liquid C. At this time, the cleaning liquid C in the space S is discharged through at least one of the through-holes 105 and 115 and the gaps G.

For example, the cleaning liquid C flowing into the space S transmits an ultrasonic wave. The ultrasonic wave loosens the flux remaining in the space S, from the FPC 17. Thereafter, the cleaning liquid C is discharged from the space S together with the flux as described above. Thus, mounting of the components on the FPC 17 is completed.

The cleaning liquid C also flows into each cutout 131. The cutout 131 is provided with the holding protrusions 135 and 136 and the reinforced pin 123 is accommodated in the cutout 131, and thereby a minute gap in which the cleaning liquid C and the flux tend to remain is formed, in some cases. However, the minute gap communicates with the space S enlarged by the raised parts P, and the cleaning liquid C readily flows therein. Therefore, the cleaning liquid C and the flux in the minute gap can be readily discharged.

Furthermore, in some cases, a dead end D is provided between the FPC 17 and the joined part 141 and intermediate part 143 of the reinforced pin 123. However, the dead end D communicates with the space S enlarged by the raised parts P, and the cleaning liquid C easily flows into the dead end D. Furthermore, the raised parts P can expand the dead end D by raising the relay connector 76 in the +Z-direction. Therefore, the cleaning liquid C and the flux at the dead end D can be readily discharged.

Note that the liquid flowing into the space S is not limited to the cleaning liquid C. For example, In the case of using an SSD as the storage, a coolant such as purified water may flow into the space S. Due to the raised parts P and the flat part F of the FPC 17, the coolant can efficiently flow through the space S.

In the HDD 10 according to the first embodiment described above, the FPC 17 includes the base layer 81, the conductive layer 82, and the conductive layer 83. The conductive layer 82 is provided on the upper surface 81a of the base layer 81. The conductive layer 83 is provided on the lower surface 81b of the base layer 81 opposite to the upper surface 81a. The conductive layer 82 is provided with the reinforcement pads 92. The conductive layer 83 covers the reinforcement pads 92 via the base layer 81 in the +Z-direction in which the upper surface 81a faces. The relay connector 76 includes the reinforced pins 123 joined to the reinforcement pads 92. The reinforcement pads 92 are pressed by the conductive layer 83 in the +Z-direction, as compared with the reinforcement pad 92 not covered by the conductive layer 83. Thereby, the relay connector 76 joined to the reinforcement pads 92 is displaced in the +Z-direction, increasing the distance between the FPC 17 and the case 121 of the relay connector 76. This further leads to enlarging the space S between the FPC 17 and the case 121 of the relay connector 76, allowing the liquid to easily flow through the space S. For example, the cleaning liquid C can readily flow through the space S. Thereby, the HDD 10 can prevent the substance, such as flux residue that may cause contamination, from remaining in-between the FPC 17 and the relay connector 76. As such, the HDD 10 of the present embodiment can be avoided from contamination and occurrence of a failure such as head crash due to a contaminant. In addition, the coolant readily flows through the space S to be able to efficiently cool the relay connector 76.

The two reinforcement pads 92 are disposed at an interval in the X-direction along the upper surface 81*a*. The two reinforced pins 123 are disposed and joined to the two reinforcement pads 92 at an interval in the X-direction. In-between the base layer 81 and the relay connector 76, the conductive layer 82 is provided with the gap between the two reinforcement pads 92. In other words, there is a part including no conductive layer 82 between the two reinforcement pads 92. This creates a recess in the FPC 17 between the base layer 81 and the relay connector 76. The reinforcement pads 92 are pressed by the conductive layer 83 in the +Z-direction, as compared with the reinforcement pads 92 not covered by the conductive layer 83, which enlarges the recess in the FPC 17. This consequently enlarges the space S between the FPC 17 including the recess and the case 121 of the relay connector 76, making it easier for the liquid to flow through the space S.

The conductive layer 83 is provided with the two support pads 95 disposed at an interval in the X-direction and with the gap between the two support pads 95. The two support pads 95 cover the two reinforcement pads 92 in the +Z-direction via the base layer 81. In other words, there is a part including no conductive layer 83, between the two support pads 95. Because of this, the support pads 95 press the reinforcement pads 92 in the +Z-direction to deepen the recess in the FPC 17. As a result, the space S between the FPC 17 with the recess and the case 121 of the relay connector 76 is enlarged, allowing the liquid to readily flow through the space S.

On the projection plane as viewed in the +Z-direction, the two reinforcement pads 92 and the two support pads 95 have the same shape. This can allow setting of a larger recess in the FPC 17 and a larger space S including the recess.

The conductive layer 82 is provided with the connection pads 91 that transmit electric signals. The relay connector 76 further includes the lead wires 122 joined to the connection pads 91. The two support pads 95 are set to the ground potential and are spaced from the connection pads 91 on the projection plane as viewed in the +Z-direction. Thereby, the support pads 95 can be avoided from having an influence, such as noise, on the electric signals running through the connection pads 91.

The FPC 17 further includes the cover layer 84 covering the upper surface 81*a*. The cover layer 84 is provided with the through-hole 105 covered by the relay connector 76. On the projection plane as viewed in the +Z-direction, in the Y-direction along the upper surface 81*a* and orthogonal to the X-direction, the ends 105*a* of the through-hole 105 are located outside the relay connector 76. As such, the liquid can readily flow through the space S between the FPC 17 and the case 121 of the relay connector 76 through the through-hole 105.

The reinforced plate 77 includes the attachment surface 77*a* attached to the FPC 17 and the protrusions 111 protruding from the attachment surface 77*a*. The FPC 17 is interposed between the relay connector 76 and the reinforced plate 77. The protrusions 111 cover the two reinforcement pads 92 in the +Z-direction via the base layer 81. The reinforcement pads 92 are pressed by the protrusions 111 in the +Z-direction, as compared with the reinforcement pads 92 not covered by the protrusions 111. This can enlarge the space S between the FPC 17 and the case 121 of the relay connector 76, allowing the liquid to readily flow through the space S.

The two protrusions 111 are disposed at an interval in the X-direction. The reinforced plate 77 is provided with the gap between the two protrusions 111. In other words, the reinforced plate 77 has a part, in-between the two protrusions 111, including no protrusions 111. Because of this, the protrusions 111 press the reinforcement pads 92 in the +Z-direction to be able to deepen the recess in the FPC 17. This can consequently enlarge the space S between the FPC 17 with the recess and the case 121 of the relay connector 76, allowing the liquid to readily flow through the space S.

Second Embodiment

A second embodiment will be described below with reference to FIG. 6. Note that in the following descriptions of a plurality of embodiments, component elements having functions similar to those of the component elements having been described are denoted by the same reference numerals as those of the component elements having been descried above, and the description thereof may be omitted. In addition, a plurality of the component elements denoted by the same reference numerals does not necessarily have all the functions and properties in common, and may have different functions and properties according to each embodiment.

Figure 6:
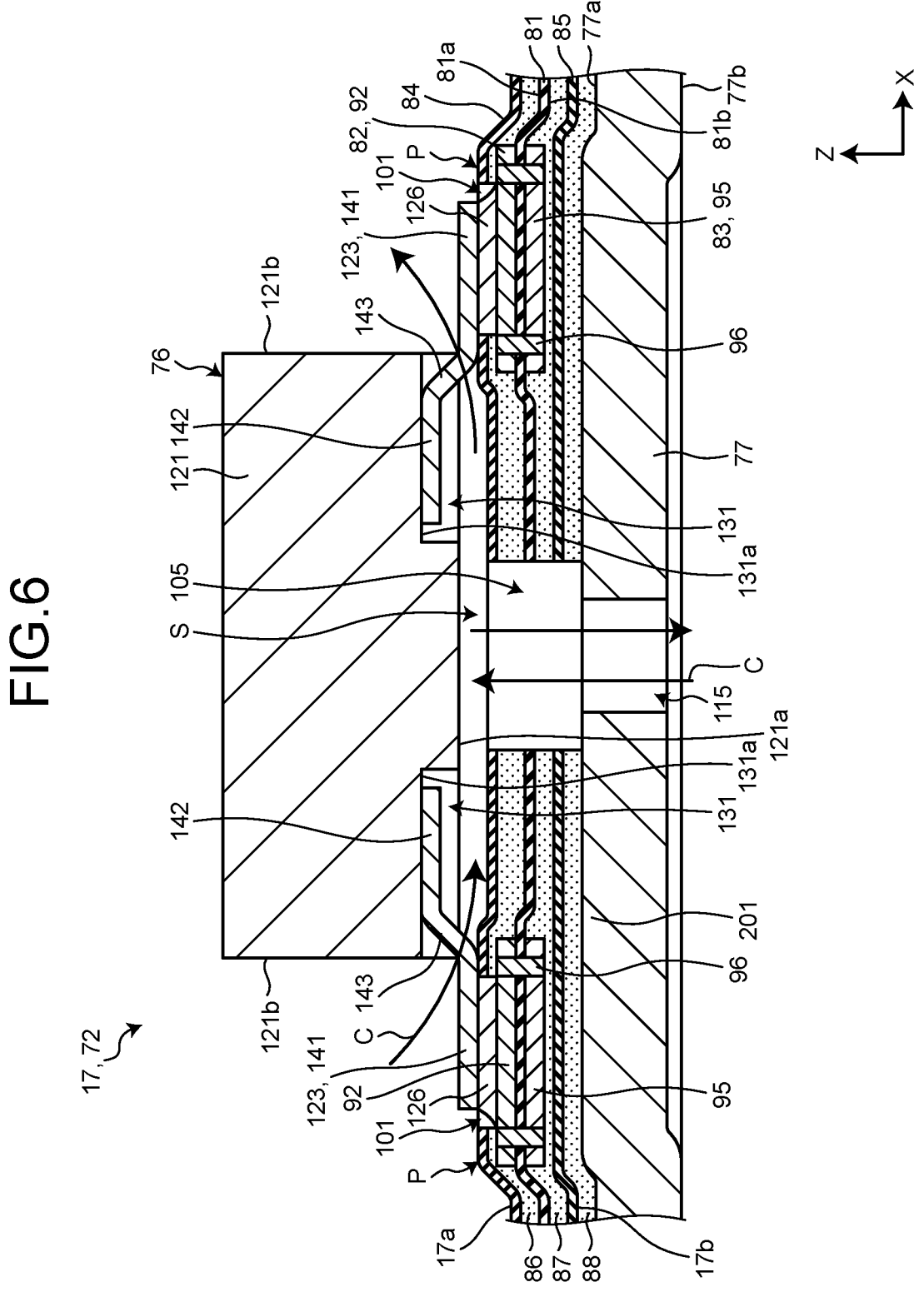
FIG. 6 is an exemplary cross-sectional view of part of the second connecting part according to a second embodiment.

FIG. 6 is an exemplary cross-sectional view of part of the second connecting part 72 according to the second embodiment. As illustrated in FIG. 6, the reinforced plate 77 of the second embodiment includes a protruding part 201 instead of the plurality of protrusions 111.

The protruding part 201 protrudes substantially in the +Z-direction from the attachment surface 77*a* of the reinforced plate 77. On the projection plane as viewed in the +Z-direction, the protruding part 201 is larger in size than the relay connector 76. The protruding part 201 covers the relay connector 76 entirely in the +Z-direction via the base layer 81.

The whole relay connector 76 is raised in the +Z-direction by the protruding part 201. Therefore, the relay connector 76 protrudes beyond other components positioned around the relay connector 76, and is readily exposed to the cleaning liquid C and the ultrasonic wave in the ultrasonic cleaning. The cleaning liquid C and the ultrasonic wave directly reach the relay connector 76, and therefore, the relay connector 76 is cleaned more efficiently.

In the HDD 10 of the second embodiment described above, the protruding part 201 covers the relay connector 76 entirely in the +Z-direction via the base layer 81. Thereby, the whole relay connector 76 is displaced in the +Z-direction relative to the other components not covered by the protruding part 201. Accordingly, the relay connector 76 is more exposed to the liquid than the other components not covered by the protruding part 201. For example, the more exposure to the cleaning liquid C can ensure that the relay connector 76 is washed.

Third Embodiment

Figure 7:
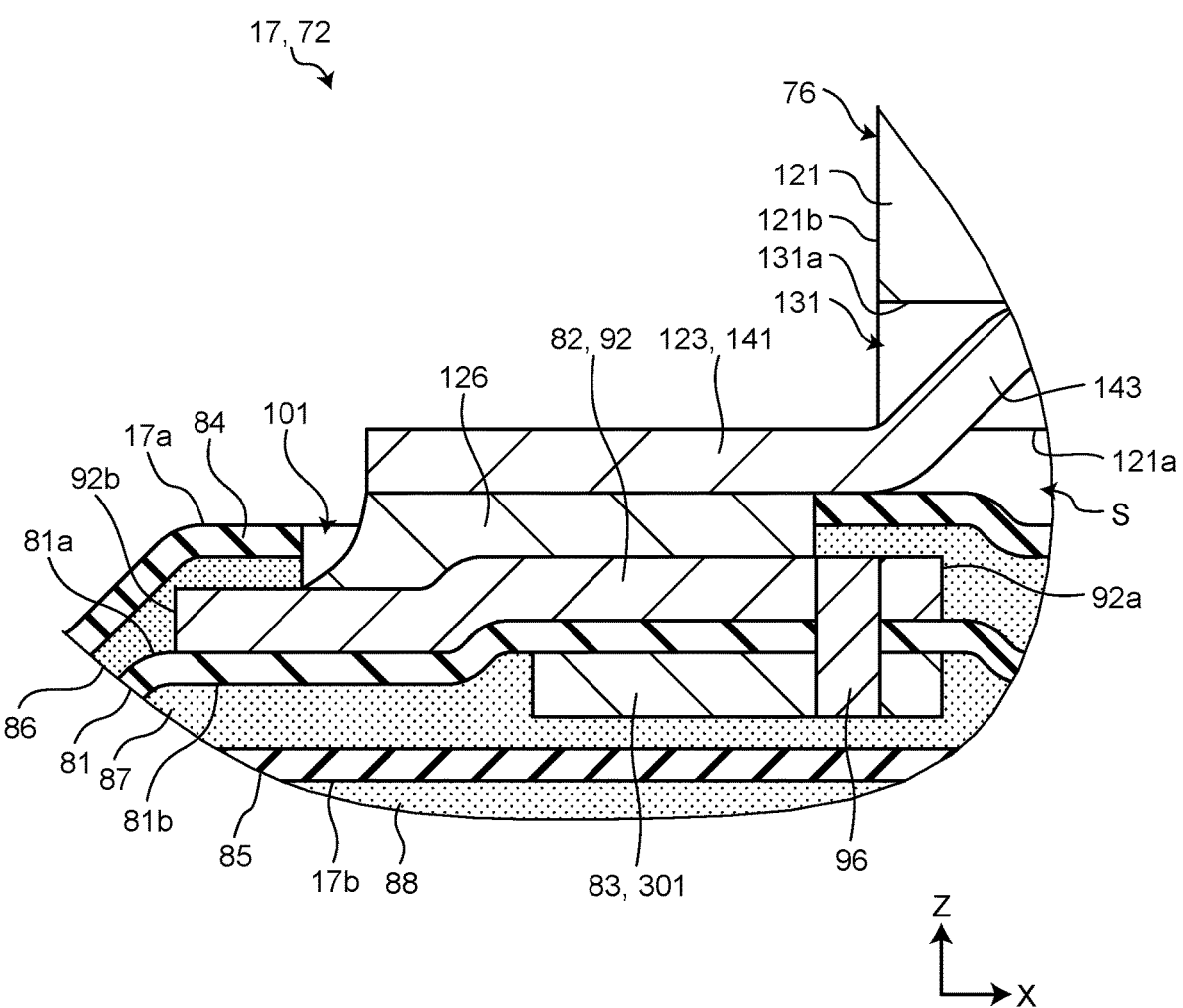
FIG. 7 is an exemplary cross-sectional view of part of the second connecting part according to a third embodiment.

A third embodiment will be described below with reference to FIG. 7. FIG. 7 is an exemplary cross-sectional view of part of the second connecting part 72 according to the third embodiment. As illustrated in FIG. 7, the conductive layer 83 of the third embodiment is provided with a plurality of support pads 301 instead of the plurality of support pads 95. The plurality of support pads 301 is substantially equal to the plurality of support pads 95, except for the following descriptions.

Each of the plurality of support pads 301 is smaller than a corresponding one of the plurality of reinforcement pads 92. At least the length of the support pad 301 in the X-direction is smaller than the length of the support pad 95 in the X-direction.

Each of the plurality of reinforcement pads 92 includes ends 92*a* and 92*b* in the X-direction. The end 92*a* is an example of an inner end of the first land. The end 92*b* is an example of an outer end of the first land.

The end 92*a* is an end of the reinforcement pad 92 in a direction toward the center of the relay connector 76 in the X-direction (hereinafter, referred to as inward direction). The end 92*b* is an end of the reinforcement pad 92 in a direction opposite to the inward direction (hereinafter, referred to as outward direction).

The plurality of support pads 301 individually covers the corresponding ends 92*a* of the plurality of reinforcement pads 92 in the +Z-direction via the base layer 81. Meanwhile, the plurality of support pads 301 does not cover the ends 92*b* of the plurality of reinforcement pads 92. In other words, on the projection plane as viewed in the +Z-direction, the plurality of support pads 301 are spaced from the ends 92*b* of the plurality of reinforcement pads 92.

The support pad 301 described above raises the end 92*a* of the reinforcement pad 92 in the +Z-direction, but does not raise the end 92*b* of the reinforcement pad 92. Therefore, the reinforcement pad 92 extends obliquely relative to the upper surface 81*a* of the base layer 81 so as to approach the base layer 81 in the outward direction.

In the HDD 10 of the third embodiment described above, the two support pads 301 cover the inner ends 92*a* of the two reinforcement pads 92 via the base layer 81 in the +Z-direction. Furthermore, the two support pads 301 are spaced from the outer ends 92*b* of the reinforcement pads 92, on the projection plane as viewed in the +Z-direction. In other words, the inner ends 92*a* of the reinforcement pads 92 are pressed by the support pads 301 in the +Z-direction but the outer ends 92*b* of the reinforcement pads 92 are not. That is, the two reinforcement pads 92 are inclined in a tapered manner in the +Z-direction, allowing the liquid to be readily discharged to the outside.

In the above descriptions, "suppress" is defined as, for example, preventing occurrence of an event, action, or influence, or reducing the degree of the event, action, or influence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a flexible printed circuit board including
      a first insulating layer,
      a first conductive layer on a first surface of the first insulating layer, the first conductive layer being provided with at least one land, and
      a second conductive layer on a second surface of the first insulating layer, to cover the at least one land via the first insulating layer in a first direction in which the first surface faces, the second surface being opposite the first surface; and an electronic component including at least one pin joined to the at least one land, wherein
   the at least one land includes two first lands disposed at an interval in a second direction along the first surface,
   the at least one pin includes two first pins disposed and bonded to the two first lands at an interval in the second direction,
   in between the first insulating layer and the electronic component, the first conductive layer is provided with a gap between the two first lands,
   the second conductive layer is provided with two second lands disposed at an interval in the second direction and with a gap between the two second lands, and
   the two second lands cover the two first lands via the first insulating layer in the first direction.

2. The storage device according to claim 1, wherein
   on a projection plane as viewed in the first direction, the two first lands and the two second lands have a same shape.

3. The storage device according to claim 1, wherein
   the two second lands cover inner ends of the two first lands via the first insulating layer in the first direction, and
   on a projection plane as viewed in the first direction, the two second lands are spaced from outer ends of the two first lands.

4. The storage device according to claim 1, wherein
   the first conductive layer is provided with a third land that transmits an electric signal,
   the electronic component further includes a second pin joined to the third land,
   the two second lands are set to a ground potential, and
   on a projection plane as viewed in the first direction, the two second lands are spaced from the third land.

5. The storage device according to claim 1, wherein
   the flexible printed circuit board further includes a second insulating layer covering the first surface,
   the second insulating layer is provided with a through-hole covered by the electronic component, and
   on a projection plane as viewed in the first direction, an end of the through-hole in a third direction is located outside the electronic component, the third direction being along the first surface and orthogonal to the second direction.

6. The storage device according to claim 1, further comprising
   a wall including a third surface attached to the flexible printed circuit board, a protruding part of the wall protruding from the third surface, wherein
   the flexible printed circuit board is interposed between the electronic component and the wall, and
   the protruding part covers the two first lands via the first insulating layer in the first direction.

7. The storage device according to claim 6, wherein
   the protruding part includes two protrusions disposed at an interval in the second direction, and
   the wall is provided with a gap between the two protrusions.

8. The storage device according to claim 6, wherein
   the protruding part covers the electronic component entirely via the first insulating layer in the first direction.

9. A storage device comprising:

a flexible printed circuit board including a first insulating layer, a first conductive layer on a first surface of the first insulating layer, the first conductive layer being provided with at least one land, and a second conductive layer on a second surface of the first insulating layer, to cover the at least one land via the first insulating layer in a first direction in which the first surface faces, the second surface being opposite the first surface; and an electronic component including at least one pin joined to the at least one land, wherein the at least one land includes two first lands disposed at an interval in a second direction along the first surface, the at least one pin includes two first pins disposed and bonded to the two first lands at an interval in the second direction, in between the first insulating layer and the electronic component, the first conductive layer is provided with a gap between the two first lands, the flexible printed circuit board further includes a second insulating layer covering the first surface, the second insulating layer is provided with a through-hole covered by the electronic component, and on a projection plane as viewed in the first direction, an end of the through-hole in a third direction is located outside the electronic component, the third direction being along the first surface and orthogonal to the second direction.

10. The storage device according to claim 9, wherein the second conductive layer is provided with two second lands disposed at an interval in the second direction and with a gap between the two second lands, and the two second lands cover the two first lands via the first insulating layer in the first direction.

11. The storage device according to claim 10, wherein on a projection plane as viewed in the first direction, the two first lands and the two second lands have a same shape.

12. The storage device according to claim 10, wherein the two second lands cover inner ends of the two first lands via the first insulating layer in the first direction, and on a projection plane as viewed in the first direction, the two second lands are spaced from outer ends of the two first lands.

13. The storage device according to claim 10, wherein the first conductive layer is provided with a third land that transmits an electric signal, the electronic component further includes a second pin joined to the third land, the two second lands are set to a ground potential, and on a projection plane as viewed in the first direction, the two second lands are spaced from the third land.

14. A storage device comprising:

a flexible printed circuit board including a first insulating layer, a first conductive layer on a first surface of the first insulating layer, the first conductive layer being provided with at least one land, and a second conductive layer on a second surface of the first insulating layer, to cover the at least one land via the first insulating layer in a first direction in which the first surface faces, the second surface being opposite the first surface;

an electronic component including at least one pin joined to the at least one land; and a wall including a third surface attached to the flexible printed circuit board, a protruding part of the wall protruding from the third surface, wherein the at least one land includes two first lands disposed at an interval in a second direction along the first surface, the at least one pin includes two first pins disposed and bonded to the two first lands at an interval in the second direction, in between the first insulating layer and the electronic component, the first conductive layer is provided with a gap between the two first lands, the flexible printed circuit board is interposed between the electronic component and the wall, and the protruding part covers the two first lands via the first insulating layer in the first direction.

15. The storage device according to claim 14, wherein the second conductive layer is provided with two second lands disposed at an interval in the second direction and with a gap between the two second lands, and the two second lands cover the two first lands via the first insulating layer in the first direction.

16. The storage device according to claim 15, wherein on a projection plane as viewed in the first direction, the two first lands and the two second lands have a same shape.

17. The storage device according to claim 15, wherein the two second lands cover inner ends of the two first lands via the first insulating layer in the first direction, and on a projection plane as viewed in the first direction, the two second lands are spaced from outer ends of the two first lands.

18. The storage device according to claim 15, wherein the first conductive layer is provided with a third land that transmits an electric signal, the electronic component further includes a second pin joined to the third land, the two second lands are set to a ground potential, and on a projection plane as viewed in the first direction, the two second lands are spaced from the third land.

\* \* \* \* \*